US012652818B2

(12) United States Patent (10) Patent No.: US 12,652,818 B2
Tasai et al. (45) Date of Patent: Jun. 9, 2026

(54) SEMICONDUCTOR DEVICE AND WIRELESS COMMUNICATION DEVICE

(71) Applicant: SONY GROUP CORPORATION, Tokyo (JP)

(72) Inventors: Kunihiko Tasai, Tokyo (JP); Takafumi Makino, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 377 days.

(21) Appl. No.: 18/552,199

(22) PCT Filed: Jan. 13, 2022

(86) PCT No.: PCT/JP2022/000893
§ 371 (c)(1),
(2) Date: Sep. 25, 2023

(87) PCT Pub. No.: WO2022/219861
PCT Pub. Date: Oct. 20, 2022

(65) Prior Publication Data
US 2024/0170565 A1      May 23, 2024

(30) Foreign Application Priority Data

Apr. 15, 2021     (JP) ................................. 2021-068919

(51) Int. Cl.
H10D 30/47          (2025.01)
H01L 21/02          (2006.01)
(Continued)

(52) U.S. Cl.
CPC ..... H10D 30/475 (2025.01); H01L 21/02458 (2013.01); H01L 21/0254 (2013.01);
(Continued)

(58) Field of Classification Search
CPC ............. H10D 30/475; H10D 62/8503; H10D 62/854; H01L 21/02458; H01L 21/0254; H01L 21/20
See application file for complete search history.

(56) References Cited

U.S. PATENT DOCUMENTS

2011/0278647 A1*  11/2011  Hashimoto ........ H10D 30/4755
                                             257/E21.403
2016/0172478 A1*   6/2016  Kotani ................. H10D 30/475
                                             257/190
(Continued)

FOREIGN PATENT DOCUMENTS

JP       2006-261642  A      9/2006
JP       2014-197645  A     10/2014
(Continued)

OTHER PUBLICATIONS

International Search Report and Written Opinion of PCT Application No. PCT/JP2022/000893, issued on Apr. 5, 2022, 08 pages of ISRWO.

*Primary Examiner* — David Vu
*Assistant Examiner* — Brandon C Fox
(74) *Attorney, Agent, or Firm* — CHIP LAW GROUP

(57) ABSTRACT
A semiconductor device capable of reducing density of threading potential without increasing a leakage current is provided. A semiconductor device including a channel layer that is included in a laminated body of a nitride semiconductor provided on a substrate, and a barrier layer that is included in the laminated body on an upper layer side with respect to the channel layer, in which the laminated body on a lower layer side with respect to the channel layer includes an n-type conversion factor that converts the nitride semiconductor into an n-type in a concentration profile having at least one or more peaks in a lamination direction of the laminated body, and a compensated area including $6\times10^{18}$
(Continued)

$cm^{-3}$ or more of a compensation factor for compensating for the n-type conversion factor is provided in the laminated body on an upper layer side with respect to peaks of the concentration profile of the n-type conversion factor.

17 Claims, 17 Drawing Sheets

(51) Int. Cl.
  H01L 21/20 (2006.01)
  H10D 62/85 (2025.01)
  H10D 62/854 (2025.01)

(52) U.S. Cl.
  CPC ......... H01L 21/20 (2013.01); H10D 62/8503 (2025.01); H10D 62/854 (2025.01)

(56) References Cited

U.S. PATENT DOCUMENTS

| | | | |
|---|---|---|---|
| 2018/0204916 A1* | 7/2018 | Shimizu | H10D 62/824 |
| 2021/0125825 A1* | 4/2021 | Cheng | H01L 21/0254 |

FOREIGN PATENT DOCUMENTS

| | | |
|---|---|---|
| JP | 2015-029042 A | 2/2015 |
| JP | 2018-088528 A | 6/2018 |
| WO | 2016/143381 A1 | 9/2016 |

* cited by examiner

SEMICONDUCTOR DEVICE AND WIRELESS COMMUNICATION DEVICE

CROSS REFERENCE TO RELATED APPLICATIONS

This application is a U.S. National Phase of International Patent Application No. PCT/JP2022/000893 filed on Jan. 13, 2022, which claims priority benefit of Japanese Patent Application No. JP 2021-068919 filed in the Japan Patent Office on Apr. 15, 2021. Each of the above-referenced applications is hereby incorporated herein by reference in its entirety.

TECHNICAL FIELD

The present disclosure relates to a semiconductor device and a wireless communication device.

BACKGROUND ART

In recent years, semiconductor devices such as high electron mobility transistors (HEMTs) using nitride semiconductors have been developed. High electron mobility transistors (HEMTs) have high electron mobility and saturated electron speed, and have high withstand voltage. Thus, high electron mobility transistors are expected to be used as high-output and high-efficiency transistors such as high-frequency devices, power devices, and the like.

Here, in a semiconductor device using a nitride semiconductor, it is desired to reduce crystal defects in the nitride semiconductor in order to improve device characteristics. For example, threading dislocations occurring during crystal growth of a nitride semiconductor cause current collapse to thereby cause fluctuations in the output of semiconductor devices, and thus threading dislocations are required to be reduced.

For example, PTL 1 below discloses a technique for reducing the occurrence of threading dislocations by introducing a mask layer into a laminated body of a nitride semiconductor.

CITATION LIST

Patent Literature

[PTL 1]
  JP 2018-88528A

SUMMARY

Technical Problem

However, in the technique disclosed in PTL 1, constituent atoms of a mask layer may unintentionally convert the surrounding nitride semiconductor into an n-type, thereby increasing a leakage current. For this reason, there has been a demand for a technique for reducing the occurrence of threading dislocations without degrading other device characteristics.

Consequently, the present disclosure proposes a new and improved semiconductor device capable of reducing the density of threading dislocations without increasing a leakage current, and a wireless communication device including the semiconductor device.

Solution to Problem

According to the present disclosure, there is provided a semiconductor device including a channel layer that is included in a laminated body of a nitride semiconductor provided on a substrate, and a barrier layer that is included in the laminated body on an upper layer side with respect to the channel layer, in which the laminated body on a lower layer side with respect to the channel layer includes an n-type conversion factor that converts the nitride semiconductor into an n-type in a concentration profile having at least one or more peaks in a lamination direction of the laminated body, and a compensated area including $6\times10^{18}$ cm$^{-3}$ or more of a compensation factor for compensating for the n-type conversion factor is provided in the laminated body on an upper layer side with respect to peaks of the concentration profile of the n-type conversion factor.

According to the present disclosure, there is provided a wireless communication device including a semiconductor device, in which the semiconductor device includes a channel layer that is included in a laminated body of a nitride semiconductor provided on a substrate, and a barrier layer that is included in the laminated body on an upper layer side with respect to the channel layer, in which the laminated body on a lower layer side with respect to the channel layer includes an n-type conversion factor that converts the nitride semiconductor into an n-type in a concentration profile having at least one or more peaks in a lamination direction of the laminated body, and a compensated area including $6\times10^{18}$ cm$^{-3}$ or more of a compensation factor for compensating for the n-type conversion factor is provided in the laminated body on an upper layer side with respect to peaks of the concentration profile of the n-type conversion factor.

DESCRIPTION OF EMBODIMENTS

Figure 1:
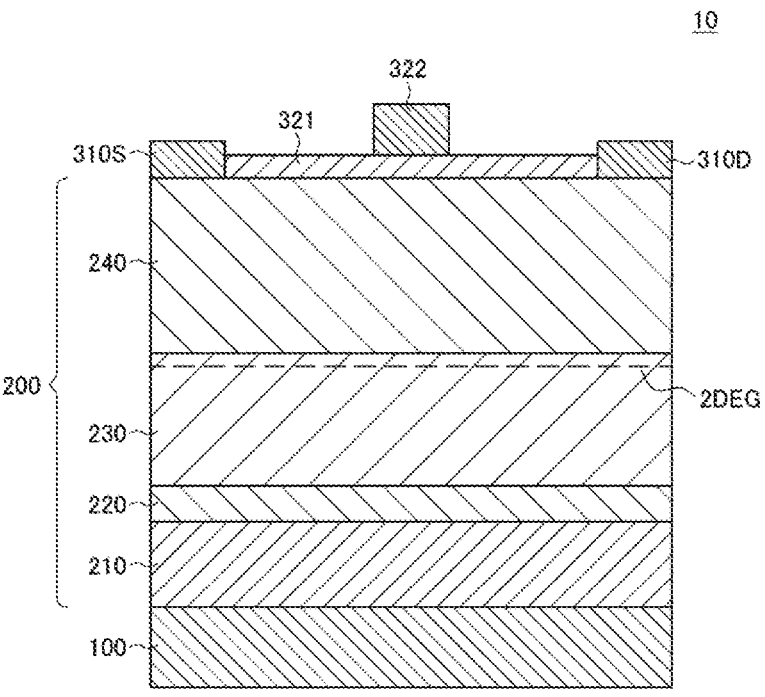
FIG. 1 is a longitudinal sectional view schematically illustrating a configuration example of a semiconductor device according to a first embodiment of the present disclosure.

Preferred embodiments of the present disclosure will be described in detail with reference to the accompanying figures below. Note that, in the present specification and the drawing, components having substantially the same functional configuration will be denoted by the same reference numerals, and thus repeated descriptions thereof will be omitted.

Note that, in the present specification, a lamination direction of a substrate and layers is also referred to as a vertical direction. A direction in which the substrate is present is also referred to as a downward direction, and a direction opposite to the direction in which the substrate is present is also referred to as an upward direction.

A description will be given in the following order.
1. Configuration Example of Semiconductor Device
2. Method of Manufacturing Semiconductor Device
3. Specific Example of Semiconductor Device
4. Configuration Example of Wireless Communication Device
<1. Configuration Example of Semiconductor Device>
First, a configuration example of a semiconductor device according to a first embodiment of the present disclosure will be described with reference to FIG. 1. FIG. 1 is a schematic longitudinal sectional view illustrating a configuration example of a semiconductor device 10 according to the present embodiment.

As illustrated in FIG. 1, the semiconductor device 10 includes a substrate 100, a laminated body 200, an insulating film 321, a gate electrode 322, a source electrode 310S, and a drain electrode 310D. The semiconductor device 10 is, for example, a so-called high electron mobility transistor (HEMT).

The substrate 100 is a substrate that supports the laminated body 200 constituting the semiconductor device 10. The substrate 100 may be a Si substrate. Alternatively, the substrate 100 may be a substrate formed of SiC, sapphire, GaN, AlN, diamond, or the like.

The laminated body 200 is a laminated body including a buffer layer 210, a mask layer 220, a channel layer 230, and a barrier layer 240 in order from the substrate 100 side. The laminated body 200 is provided by epitaxially growing a nitride semiconductor, which is a group III-V compound semiconductor, on the substrate 100. The laminated body

200 may be configured to include at least one or more of AlN, InN, GaN, AlGaN, InGaN, AlInGaN, AlScN, SiN, MgN, or TiN.

The buffer layer 210 is provided on the substrate 100. The buffer layer 210 is provided to change a lattice constant in a stepwise manner when a nitride semiconductor having a lattice constant significantly different from that of the material forming the substrate 100 is crystal-grown on the substrate 100.

Specifically, when GaN is crystal-grown on the substrate 100, which is a Si substrate, the buffer layer 210 may be formed of Al(In)(Ga)N. Al(In)(Ga)N represents a nitride semiconductor in which Al and N are essential elements and In and Ga are optional elements. Specifically, Al(In)(Ga)N is AlInGaN, AlGaN, AlInN, or AlN.

The buffer layer 210 may be configured by laminating a plurality of layers having different composition ratios so that an Al composition proportion decreases toward the upper layer side of the laminated body 200. Alternatively, the buffer layer 210 may be constituted by a layer having a composition ratio gradient such that an Al composition proportion gradually decreases toward the upper layer side of the laminated body 200.

For example, when GaN is crystal-grown on the substrate 100, which is a Si substrate, the buffer layer 210 may have a two-layer structure in which an AlN layer and an AlGaN layer are laminated in order from the Si substrate side. In such a case, the thickness of the AlN layer may be, for example, 100 nm to 300 nm, and the thickness of the AlGaN layer may be, for example, 100 nm to 500 nm. The Al composition proportion of the AlGaN layer is, for example, 0.17 to 0.50.

The mask layer 220 is provided on the buffer layer 210. The mask layer 220 is formed of SiN, for example, and is provided to bend threading dislocations extending in the lamination direction of the laminated body 200 in an in-plane direction perpendicular to the lamination direction. The mask layer 220 can be formed of $SiO_2$ or TiN instead of SiN.

For example, the mask layer 220 may be provided as an island-shaped film that does not completely cover the buffer layer 210. In such a case, the mask layer 220 may not be visually recognized as a layer unlike in the longitudinal sectional view illustrated in FIG. 1. The thickness of the mask layer 220 may be, for example, 0.2 nm to 2 nm, and may further be 0.5 nm to 1 nm.

In such a case, the thickness or the like of the mask layer 220 fluctuates in the in-plane direction of the laminated body 200. For this reason, the channel layer 230 provided on the mask layer 220 preferentially grows in a region where the thickness of the mask layer 220 is thinner, and grows three-dimensionally on the mask layer 220. Thereby, dislocations occurring in the buffer layer 210 and extending in the lamination direction of the laminated body 200 due to the two-dimensional crystal growth of the nitride semiconductor are bent in the in-plane direction of the laminated body 200 by the channel layer 230 growing three-dimensionally. Thus, the mask layer 220 can reduce the density of threading dislocations penetrating the laminated body 200 in the lamination direction.

In addition, the mask layer 220 can block threading dislocations occurring in the buffer layer 210 to prevent the threading dislocations from reaching the channel layer 230. In such a case, the thicker the mask layer 220 is, the higher the coverage of the buffer layer 210 can be, and thus the effect of blocking the threading dislocations can be increased. However, as will be described later, as the thickness of the mask layer 220 increases, the concentration of Si, which is an n-type conversion factor for converting the nitride semiconductor into an n-type also increases. For this reason, it is preferable that the mask layer 220 be provided as an ultra-thin film of 0.2 nm to 2 nm, preferably 0.5 nm to 1 nm, in consideration of both of them.

The channel layer 230 is provided on the mask layer 220. The channel layer 230 is a layer including a channel through which electrons supplied from the barrier layer 240 move. Specifically, electrons supplied from the barrier layer 240 form a two-dimensional electron gas (2DEG) on the barrier layer 240 side of the channel layer 230.

The channel layer 230 is formed of, for example, GaN. The channel layer 230 may be formed of a mixed crystal containing (Al)(In)(Ga)N other than GaN. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN. When the channel layer 230 is formed of InGaN, the channel layer 230 can also enhance the electron mobility of the channel.

As described above, the channel layer 230 is provided by three-dimensionally growing on the mask layer 220 and then two-dimensionally growing. For example, the channel layer 230 may be formed by being formed on the mask layer 220 to a thickness of approximately 300 nm in order to bend threading dislocations extending in the lamination direction of the laminated body 200 in the in-plane direction and then being formed to a thickness of 200 nm to 1700 nm in order to obtain the channel layer 230 with high crystallinity. In such a case, the channel layer 230 may be provided to a total film thickness of 500 nm to 2000 nm.

In the semiconductor device 10 according to the present embodiment, the mask layer 220 contains an n-type conversion factor for converting the nitride semiconductor into an n-type, and the channel layer 230 contains a compensation factor for compensating for the n-type conversion factor contained in the mask layer 220. The n-type conversion factor is a factor containing at least either impurities or a defect that cancels out the conversion of the nitride semiconductor into an n-type by the n-type conversion factor. The n-type conversion factor is, for example, Si (silicon), Ge (germanium), or O (oxygen). The compensation factor is a factor containing at least either an impurity or a defect that cancels out the conversion of the nitride semiconductor into an n-type by the n-type conversion factor. The compensation factor is, for example, C (carbon), Mg (magnesium), Fe (iron), or B (boron). Details of the n-type conversion factor and the compensation factor will be described below.

The barrier layer 240 is a layer that generates a high-concentration two-dimensional electron gas (2DEG) on the barrier layer 240 side of the channel layer 230 by being constituted by a nitride semiconductor having a higher conduction band minimum than the channel layer 230. For example, when the channel layer 230 is formed of GaN, the barrier layer 240 may be formed of Al(In)(Ga)N. Al(In)(Ga)N represents a nitride semiconductor in which Al and N are essential elements and In and Ga are optional elements. Specifically, Al(In)(Ga)N is AlInGaN, AlGaN, AlInN, or AlN.

Note that the concentration of the two-dimensional electron gas is determined using the height of the conduction band minimum on the outermost surface of the barrier layer 240 on the channel layer 230 side as one of parameters. For example, the higher the Al composition ratio of the barrier layer 240, the greater the polarization of the barrier layer 240 and the greater the gradient of the conduction band. As the thickness of the barrier layer 240 increases, the height of the conduction band minimum on the outermost surface of the barrier layer 240 increases. Thus, the semiconductor device 10 can obtain a two-dimensional electron gas having a desired concentration by appropriately controlling the composition and thickness of the barrier layer 240. For example, when the barrier layer 240 is formed of AlInN, the Al composition ratio of the barrier layer 240 may be 0.70 to 0.90, and the thickness of the barrier layer 240 may be 3 nm to 20 nm.

Here, a spacer layer may be provided between the barrier layer 240 and the channel layer 230. The spacer layer is formed of, for example, AlN. The spacer layer can improve characteristics of the semiconductor device 10 by suppressing fluctuations in composition at an interface between the barrier layer 240 and the channel layer 230. The spacer layer may be formed of AlGaN or AlInGaN instead of AlN. The thickness of the spacer layer may be, for example, greater than 0 nm to 3 nm, preferably 0.5 nm to 1.5 nm.

An intermediate layer may be further provided between the barrier layer 240 and the spacer layer. The intermediate layer may be formed of, for example, AlInGaN to have a thickness of 0.5 nm to 5.0 nm. The composition of the intermediate layer can be changed in a stepwise manner between the barrier layer 240 formed of AlInGaN and the spacer layer formed of AlN. The intermediate layer may be provided as a layer of which the composition gradually changes in the lamination direction of the laminated body 200.

A protection layer may be provided on the barrier layer 240. The protection layer is formed of, for example, GaN and provided as a part of the laminated body 200. Since the protection layer can suppress oxidation of the surface of the barrier layer 240, it is possible to improve the process resistance of the laminated body 200 in the manufacturing process.

The protection layer may be constituted by a mixed crystal containing (Al)(In)(Ga)N other than GaN. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN. The protection layer may be constituted by a SiN film or the like in addition to the above-described materials. The thickness of the protection layer may be, for example, 0.5 nm to 5 nm, preferably 0.5 nm to 2 nm.

The gate electrode 322 is a gate terminal of the semiconductor device 10, which is a high electron mobility transistor (HEMT), and is provided, for example, on the laminated body 200 with an insulating film 321 interposed therebetween. The gate electrode 322 is configured, for example, by sequentially laminating Ni and Au from the laminated body 200 side. The insulating film 321 is formed of, for example, SiN, $SiO_2$, $Al_2O_3$, or the like. As described above, the semiconductor device 10 may be configured to have a metal-insulator-semiconductor (MIS) gate structure in which the gate electrode 322 is provided on the laminated body 200 with the insulating film 321 interposed therebetween. However, it is needless to say that the semiconductor device 10 may be configured to have a Schottky gate structure in which the gate electrode 322 is directly provided on the laminated body 200.

The source electrode 310S and the drain electrode 310D are a source terminal and a drain terminal of the semiconductor device 10, which is a high electron mobility transistor (HEMT), and are provided on both sides of the laminated body 200 with the gate electrode 322 interposed therebetween. The source electrode 310S and the drain electrode 310D are configured, for example, by sequentially laminating Ti, Al, Ni, and Au from the laminated body 200 side.

Note that a regrowth layer may be provided directly under the source electrode 310S and the drain electrode 310D. The regrowth layer is provided by removing the barrier layer 240 directly below the region where the source electrode 310S and the drain electrode 310D are provided and a part of the channel layer 230 and then performing crystal regrowth of n-type GaN in a concave portion from which the barrier layer 240 and the like are removed. The regrowth layer is provided as a layer having a lower resistance than the barrier layer 240, and thus it is possible to reduce a resistance between the source electrode 310S, the drain electrode 310D, and the channel formed in the channel layer 230.

Alternatively, Si may be implanted in the barrier layer 240 directly below the source electrode 310S and the drain electrode 310D. The barrier layer 240 implanted with Si is annealed to have a lower resistance. Accordingly, the barrier layer 240 implanted with Si can reduce a resistance between the source electrode 310S, the drain electrode 310D, and the channel formed in the channel layer 230, similar to the regrowth layer.

Figure 2:
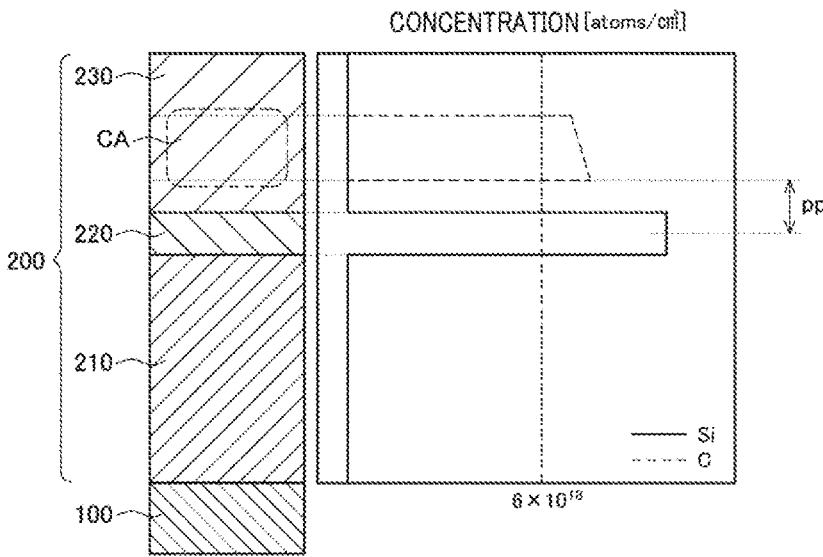
FIG. 2 is a graph diagram schematically showing concentration profiles of an n-type conversion factor and a compensation factor in a lamination direction of a laminated body.

Subsequently, an n-type conversion factor and a compensation factor included in the laminated body 200 of the semiconductor device 10 according to the present embodiment will be described with reference to FIG. 2. FIG. 2 is a graph diagram schematically showing concentration profiles of an n-type conversion factor and a compensation factor in the lamination direction of the laminated body 200.

In FIG. 2, the n-type conversion factor is Si (silicon) and the compensation factor is C (carbon). However, as described above, other than Si, Ge (germanium), O (oxygen), or the like may be applicable as an n-type conversion factor for converting a nitride semiconductor into an n-type. In addition to C, Mg (magnesium), Fe (iron), B (boron), or the like may also be applicable as a compensation factor for the n-type conversion factor.

As illustrated in FIG. 2, a concentration profile of Si (n-type conversion factor) in the laminated body 200 of the semiconductor device 10 has a peak near the mask layer 220 due to the mask layer 220 formed of SiN. For example, the concentration profile of Si in the laminated body 200 may have a peak at which the Si concentration is $6 \times 10^{18}$ cm$^{-3}$ or more near the mask layer 220, and may have a peak at which the Si concentration is $1 \times 10^{19}$ cm$^{-3}$ or more.

Si which is a Group IV is an n-type conversion factor that becomes an n-type donor by substituting Ga of a Group III in a Group III-V nitride semiconductor, and thus it is easier to make a current flow in the channel layer 230 near the mask layer 220 having a high Si concentration. Thereby, in the semiconductor device 10 provided with the mask layer 220, electrons are conducted in an unintended region to cause a leakage current or a parallel channel, which may lead to a possibility that on/off characteristics decrease and power consumption increases.

In the semiconductor device 10, a compensated area CA containing C, which is a compensation factor, at a concentration of $6 \times 10^{18}$ cm$^{-3}$ or more is provided on the upper layer side of the laminated body 200 with respect to the mask layer 220 in which a concentration profile of Si has a peak. C of a Group IV replaces N (nitrogen) of a Group V in a Group III-V nitride semiconductor, and thus C can function as a compensation factor that captures carriers supplied by Si which is an n-type conversion factor. Thus, the semiconductor device 10 can insulate the channel layer 230 in the vicinity of the mask layer 220 having a high Si concentration by controlling the concentration profile of C in the laminated body 200 and compensating for conversion into an n-type by Si with C.

The thickness of the compensated area CA containing C (carbon) at a concentration of $6 \times 10^{18}$ cm$^{-3}$ or more is preferably approximately 100 nm, and is preferably thicker in order to obtain higher insulating properties. The compensated area CA can obtain higher insulating properties by containing C at a higher concentration. For example, the compensated area CA preferably further contains C at a concentration of $2 \times 10^{19}$ cm$^{-3}$ or higher.

The concentration profile of C, which is a compensation factor, may be controlled such that the concentration of C is equal to or higher than the concentration of Si at a position where the concentration of Si, which is an n-type conversion factor, becomes a peak. For example, the concentration profile of C, which is a compensation factor, is controlled such that the concentration of C is $6 \times 10^{18}$ cm$^{-3}$ or more in a region where the concentration of Si, which is an n-type conversion factor, is $6 \times 10^{18}$ cm$^{-3}$ or more. Alternatively, the concentration profile of C, which is a compensation factor, may be controlled such that the concentration of C is less than the concentration of Si at a position where the concentration of Si, which is an n-type conversion factor, becomes a peak.

However, when the concentration of C is excessively higher than the concentration of Si, there is a possibility that the crystallinity of the nitride semiconductor will deteriorate. When the concentration of C is excessively lower than the concentration of Si, there is a possibility that electrical characteristics of the semiconductor device 10 will deteriorate. Thus, it is desirable that the concentration profile of C at the position where the concentration of Si becomes a peak be appropriately set in consideration of device characteristics required for the semiconductor device 10.

Next, an effect obtained by the semiconductor device 10 according to the present embodiment will be described.

First, an effect obtained by the mask layer 220 will be described. In the semiconductor device 10 according to the present embodiment, by introducing the mask layer 220 into the laminated body 200, the density of threading dislocations can be reduced from approximately $4.0 \times 10^{9}$ cm$^{-2}$ to approximately $2.5 \times 10^{9}$ cm$^{-2}$. That is, in the semiconductor device 10, the density of threading dislocations can be reduced by 35% or more by the mask layer 220. Accordingly, the semiconductor device 10 can reduce the density of threading dislocations on the surface of the laminated body 200 (a surface opposite to the surface on which the substrate 100 is provided) to $3 \times 10^{9}$ cm$^{-2}$ or less, and thus it is possible to suppress the occurrence of current collapse.

Next, an effect obtained by a compensation factor in the laminated body 200 will be described with reference to FIGS. 3 and 4. In the semiconductor device 10 according to the present embodiment, a sheet resistance Rsh of the channel layer 230 on the mask layer 220 side can be further increased by including a compensation factor with a predetermined concentration profile in the laminated body 200.

Figure 3:
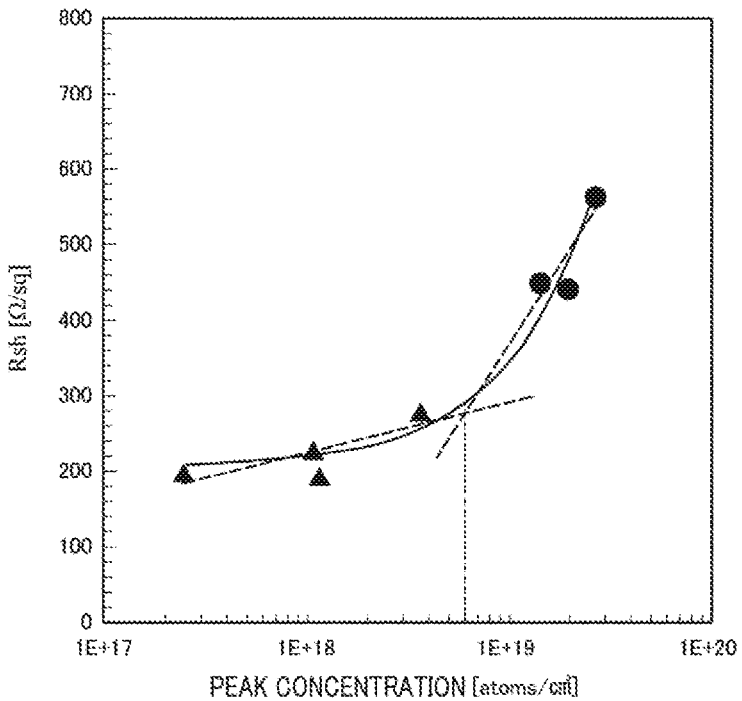
FIG. 3 is a graph diagram in which a relationship between a concentration at a peak of a concentration profile of C and a sheet resistance Rsh of a channel layer on a mask layer side is plotted.

FIG. 3 is a graph diagram in which a relationship between the concentration at the peak of a concentration profile of C and the sheet resistance Rsh of the channel layer 230 on the mask layer 220 side is plotted. In FIG. 3, the concentration at the peak of the concentration profile of Si is equal to or greater than $1 \times 10^{19}$ cm$^{-3}$. The peak of the concentration profile of C represents a peak included in the compensated area CA provided on the upper layer side of the laminated body 200 with respect to the mask layer 220 including the peak of the concentration profile of Si.

As illustrated in FIG. 3, when the concentration of C (carbon) at the peak is $6 \times 10^{18}$ cm$^{-3}$ or more (a group plotted with circles in FIG. 3), the sheet resistance Rsh of the channel layer 230 is 400 Ω/sq or more with which a leakage current can be sufficiently suppressed. On the other hand, when C (carbon) contained in the compensated area CA is less than $6 \times 10^{18}$ cm$^{-3}$ (a group plotted with triangles in FIG. 3), the sheet resistance Rsh of the channel layer 230 does not reach 400 Ω/sq or more with which a leakage current can be sufficiently suppressed. Thus, in the graph diagram illustrated in FIG. 3, it is considered that the higher the concentration of C, which is a compensation factor, the higher the insulating properties obtained and the higher the sheet resistance Rsh of the channel layer 230 on the mask layer 220 side.

In particular, in the graph diagram illustrated in FIG. 3, the sheet resistance Rsh of the channel layer 230 on the mask layer 220 side begins to increase sharply near a peak value of $6 \times 10^{18}$ cm$^{-3}$ of the concentration of C. Thus, in order to sufficiently suppress a leakage current, it is considered important that the compensated area CA contains $6 \times 10^{18}$ cm$^{-3}$ or more of C which is a compensation factor.

Figure 4:
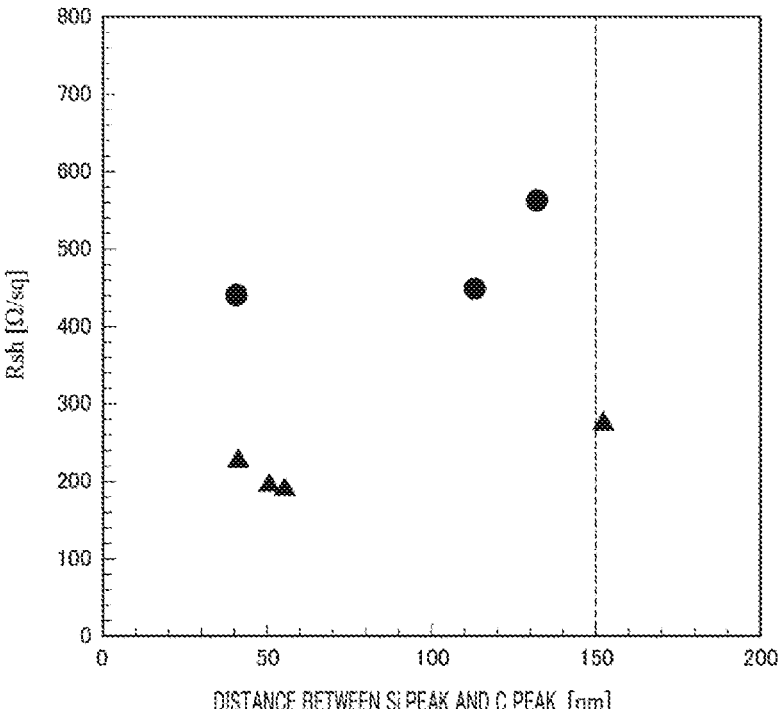
FIG. 4 is a graph diagram in which a relationship between a distance between a peak of a concentration profile of Si and a peak of a concentration profile of C and a sheet resistance Rsh of the channel layer on the mask layer side is plotted.

FIG. 4 is a graph diagram in which a relationship between a distance between a peak of a concentration profile of Si and a peak of a concentration profile of C in the lamination direction of the laminated body 200 and the sheet resistance Rsh of the channel layer 230 on the mask layer 220 side is plotted.

The peak of the concentration profile of Si represents a peak included in the mask layer 220, and the peak of the concentration profile of C represents a peak included in the compensated area CA provided on the upper layer side of the laminated body 200. Thus, a distance between both the peaks represents, for example, a distance pp between the highest point of the peak of the concentration profile of Si and the highest point of the peak of the concentration profile of C in FIG. 2.

Note that the group plotted with circles in FIG. 3 (the group in which the concentration of C at the peak is $6 \times 10^{18}$ cm$^{-3}$ or more) is also plotted with circles in FIG. 4. The group plotted with triangles in FIG. 3 (the group in which the concentration of C at the peak is less than $6 \times 10^{18}$ cm$^{-3}$) is also plotted with triangles in FIG. 4.

As illustrated in FIG. 4, as the peak of the concentration profile of Si and the peak of the concentration profile of C become closer to each other, C can compensate for the influence of Si, and thus it is considered that the sheet resistance Rsh of the channel layer 230 on the mask layer 220 side becomes higher. However, in a range where the distance between both the peaks is at least 150 nm or less, no correlation is confirmed between the distance between both the peaks and the sheet resistance Rsh. That is, when the distance between both the peaks is 150 nm or less, it is considered that both the peaks are sufficiently close to each other. Thus, it is considered that the sheet resistance of the channel layer 230 on the mask layer 220 side increases depending on the concentration at the peak of the concentration profile of C as illustrated in FIG. 3.

2. Method of Manufacturing Semiconductor Device

Figure 5A:
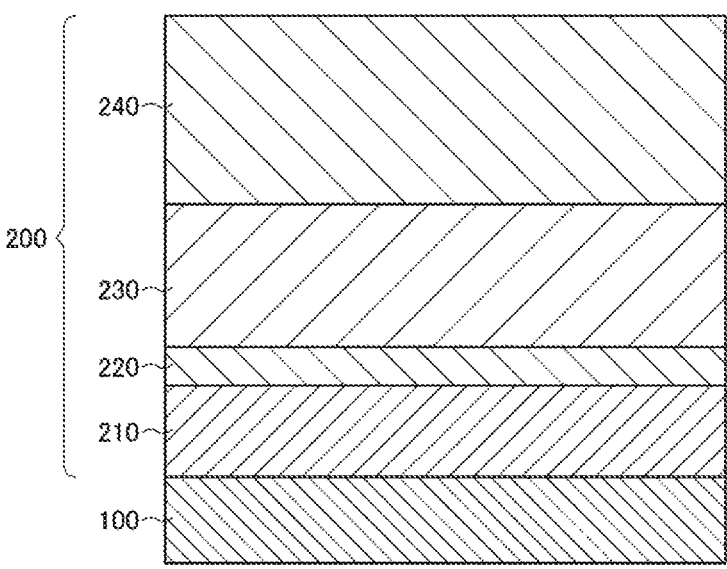
FIG. 5A is a schematic longitudinal sectional view illustrating a step of a manufacturing method for the semiconductor device according to the first embodiment.
Figure 5B:
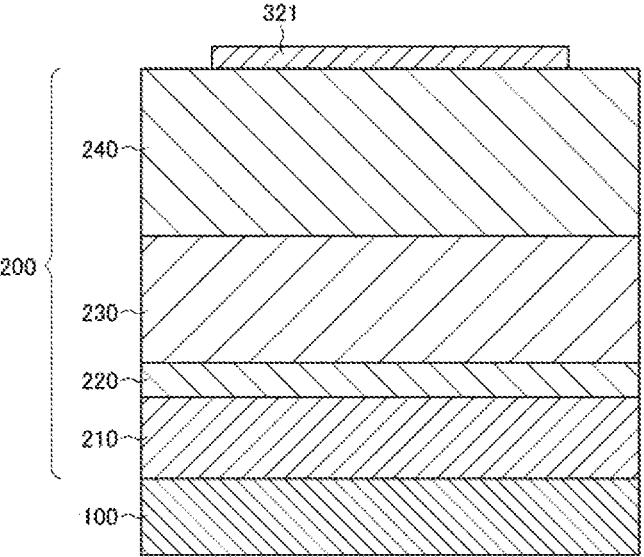
FIG. 5B is a schematic longitudinal sectional view illustrating a step of a manufacturing method for the semiconductor device according to the first embodiment.
Figure 5C:
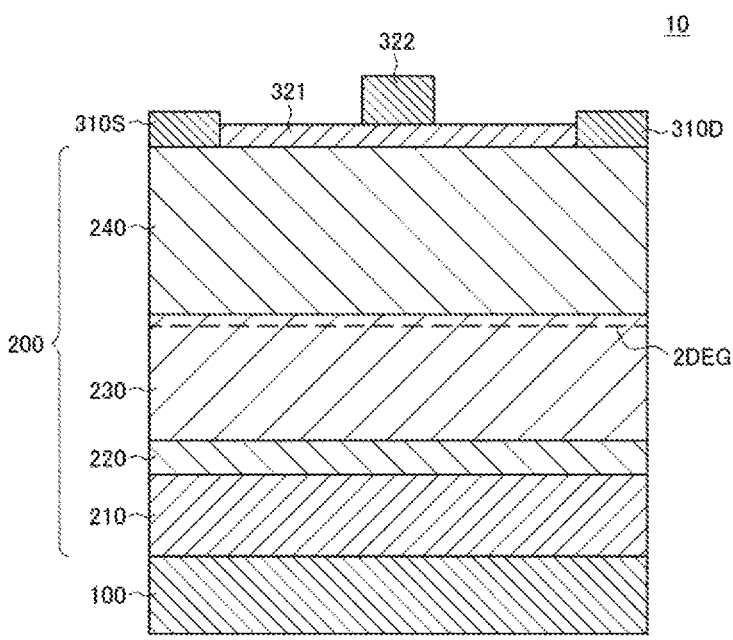
FIG. 5C is a schematic longitudinal sectional view illustrating a step of a manufacturing method for the semiconductor device according to the first embodiment.

Next, an example of a method of manufacturing the semiconductor device 10 according to the present embodiment will be described with reference to FIGS. 5A, 5B, and 5C. FIGS. 5A, 5B, and 5C are longitudinal sectional views schematically illustrating steps of the method of manufacturing the semiconductor device 10 according to the present embodiment. Note that manufacturing conditions and materials exemplified below are merely examples, and do not limit the semiconductor device 10 according to the present embodiment.

As illustrated in FIG. 5A, first, the laminated body 200 is formed on the substrate 100, which is a Si substrate, by using a metal organic chemical vapor deposition (MOCVD) method, a molecular beam epitaxy (MBE) method, or the like.

Specifically, first, a Si substrate having an insulating (111) plane as a main surface is prepared as the substrate 100. Next, the substrate 100 is introduced into an MOCVD device or an MBE device and subjected to thermal cleaning at 1000° C. for approximately 10 minutes. Subsequently, the buffer layer 210 is formed by laminating AlN on the substrate 100 to a thickness of 100 nm to 300 nm at 700° C. to 1100° C. and then laminating AlGaN to a thickness 100 nm to 500 nm at 900° C. to 1100° C.

Next, the mask layer 220 is formed on the buffer layer 210 by laminating SiN to a thickness of 0.2 nm to 2 nm at 900° C. to 1000° ° C. When the mask layer 220 is formed of SiN, an n-type conversion factor is Si.

Subsequently, the channel layer 230 is formed on the mask layer 220 by laminating GaN to a thickness of 500 nm to 2000 nm at 900° C. to 1100° C.

In the semiconductor device 10 according to the present embodiment, for example, a concentration profile of a compensation factor can be controlled by controlling crystal growth conditions of the nitride semiconductor when the channel layer 230 is formed. Specifically, when the compensation factor is C (carbon), C contained in a raw material gas of the channel layer 230 can be introduced into the channel layer 230 with a desired concentration profile by controlling a supply ratio, pressure, temperature, or the like of the source gas to the MOCVD device or the MBE device. For example, when the channel layer 230 is formed of GaN, the concentration profile of C contained in the channel layer 230 can be controlled by controlling a supply ratio, pressure, temperature, or the like of $Ga(CH_3)_3$ (trimethylgallium: TMGa), which is a raw material gas, and $NH_3$.

Thereafter, the barrier layer 240 is formed on the channel layer 230 by laminating AlInN to a thickness of 3 nm to 20 nm at 700° C. to 900° C. Note that a spacer layer obtained by laminating AlN to a thickness of 0.5 nm to 5 nm at 900° C. to 1100° C. may further be formed between the channel layer 230 and the barrier layer 240. A protection layer obtained by laminating GaN to a thickness of 0.5 nm to 5 nm at 700° ° C. to 900° C. may further be formed on the barrier layer 240.

Next, as illustrated in FIG. 5B, the insulating film 321 is formed by forming a film of SiN, $SiO_2$, $Al_2O_3$, or the like on the laminated body 200 by using a CVD method or the like. Thereafter, a resist in which a region for forming the source electrode 310S and the drain electrode 310D is open is used as a mask to remove the insulating film 321 corresponding to the opening by wet etching.

Subsequently, as illustrated in FIG. 5C, the source electrode 310S and the drain electrode 310D are formed by sequentially laminating Ti, Al, Ni, and Au on the laminated body 200 in the region where the insulating film 321 has been removed. The gate electrode 322 is formed by sequentially laminating Ni and Au on the insulating film 321 between the source electrode 310S and the drain electrode 310D.

According to the above-described manufacturing method, the semiconductor device 10 according to the present embodiment can be manufactured.

Note that, when the regrowth layer is provided directly below the source electrode 310S and the drain electrode 310D, the insulating film 321 in the region where the source electrode 310S and the drain electrode 310D are formed is removed, and then the barrier layer 240 and a part of the channel layer 230 are removed by dry etching. Thereafter, the regrowth layer can be formed by regrowing n-type GaN in a portion where the barrier layer 240 and a part of the channel layer 230 are removed by dry etching by using an MOCVD method, a sputtering method, or the like. For example, Si, Ge, or the like can be used as an n-type dopant for the regrowth layer.

It is also possible to form the mask layer 220 containing an n-type conversion factor and the channel layer 230 containing a compensation factor by a method other than the above-described method.

For example, mask layer 220 containing an n-type conversion factor and formed of SiN, SiO$_2$, TiN, or the like may be formed by removing the substrate 100 on which layers are laminated up to the buffer layer 210 from the MOCVD device or the MBE device and separately using a CVD method or the like. Thereafter, the channel layer 230 containing a compensation factor such as B may be formed by returning to the MOCVD device or the MBE device to laminate the channel layer 230 on the mask layer 220, removing the substrate 100 again from the MOCVD device or the MBE device, and implanting the compensation factor into the channel layer 230. Even with such a method, the semiconductor device 10 can achieve both reduction in threading dislocations and insulation in the vicinity of the mask layer 220.

<3. Specific Example of Semiconductor Device>

Subsequently, first to ninth specific examples of the semiconductor device 10 according to the present embodiment will be described with reference to FIGS. 6 to 14. Semiconductor devices 10A to 10I according to the first to ninth specific examples differ from each other in a layer structure and a material constituting a laminated body 200. For this reason, description of the substrate 100, the source electrode 310S, the drain electrode 310D, the insulating film 321, and the gate electrode 322 will be omitted below.

First Specific Example

Figure 6:
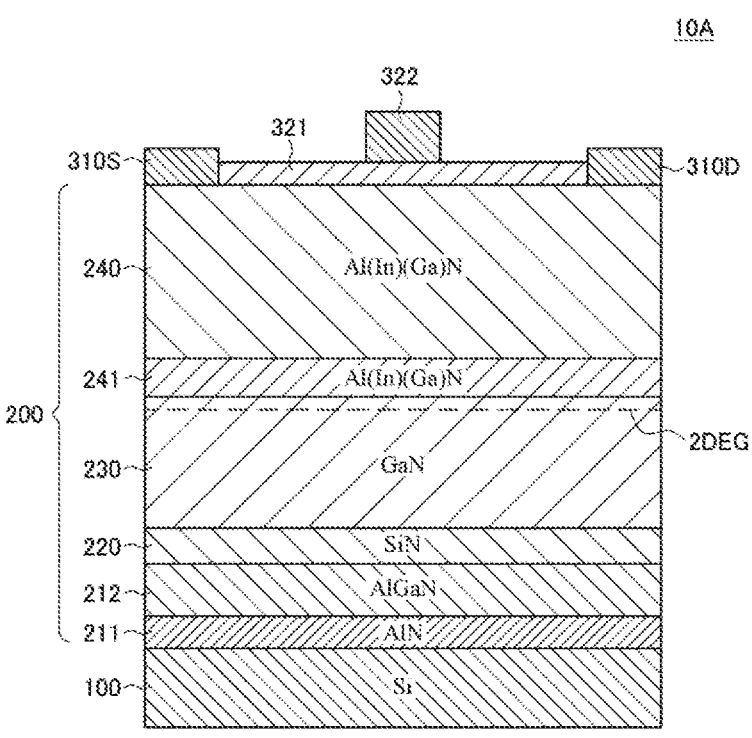
FIG. 6 is a longitudinal sectional view illustrating a configuration of a semiconductor device according to a first specific example.

FIG. 6 is a longitudinal sectional view illustrating a configuration of the semiconductor device 10A according to the first specific example. As illustrated in FIG. 6, in the semiconductor device 10A, the laminated body 200 is configured by sequentially laminating a first buffer layer 211, a second buffer layer 212, a mask layer 220, a channel layer 230, a spacer layer 241, and a barrier layer 240 in order from the side of a substrate 100 which is a Si substrate.

The first buffer layer 211 is formed of AlN, and the second buffer layer 212 is formed of AlGaN. Similarly to the buffer layer 210, in the first buffer layer 211 and the second buffer layer 212, GaN having a lattice constant different from that of Si forming the substrate 100 can be crystal-grown with higher crystallinity by changing a lattice constant in a stepwise manner.

The mask layer 220 is formed of SiN containing Si, which is an n-type conversion factor. The mask layer 220 may be constituted by an extremely thin film having a thickness of 0.2 nm to 2 nm, preferably 0.5 nm to 1 nm, or may be constituted by a thick film having a thickness exceeding several nm.

The channel layer 230 is formed of GaN. The channel layer 230 is provided with a compensated area CA containing C, which is a compensation factor, at a concentration of $6\times10^{18}$ cm$^{-3}$ or more.

The spacer layer 241 is formed of Al(In)(Ga)N. The spacer layer 241 can improve characteristics of the semiconductor device 10 by suppressing fluctuations in composition at an interface between the barrier layer 240 and the channel layer 230. Al(In)(Ga)N represents a nitride semiconductor in which Al and N are essential elements and In and Ga are optional elements. Specifically, Al(In)(Ga)N is AlInGaN, AlGaN, AlInN, or AlN.

The barrier layer 240 is formed of Al(In)(Ga)N. A two-dimensional electron gas (2DEG) is generated on the barrier layer 240 side of the channel layer 230 by bonding the barrier layer 240 and the channel layer 230. Al(In)(Ga)N represents a nitride semiconductor in which Al and N are essential elements and In and Ga are optional elements. Specifically, Al(In)(Ga)N is AlInGaN, AlGaN, AlInN, or AlN.

According to the semiconductor device 10A including the laminated body 200 described above according to the first specific example, it is possible to reduce the density of threading dislocations in the laminated body 200 without increasing a leakage current.

Second Specific Example

Figure 7:
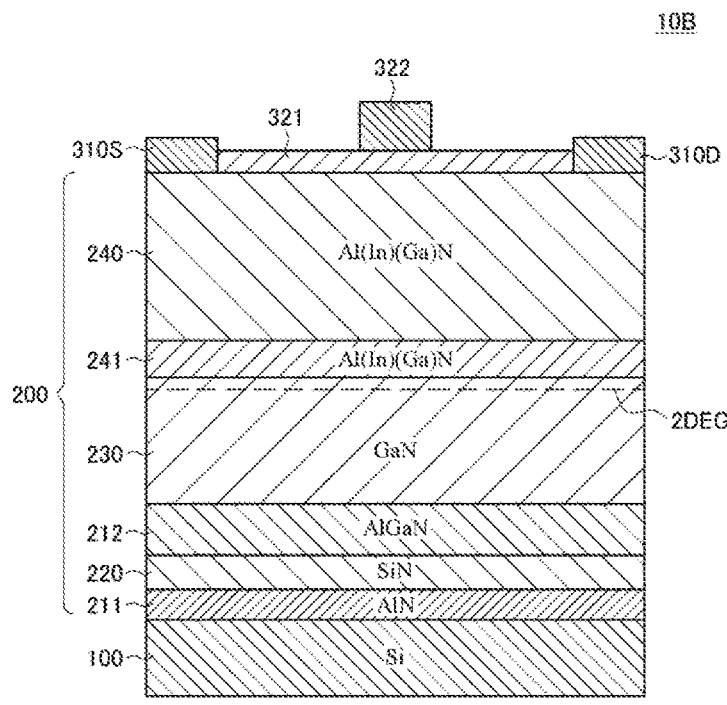
FIG. 7 is a longitudinal sectional view illustrating a configuration of a semiconductor device according to a second specific example.

FIG. 7 is a longitudinal sectional view illustrating a configuration of the semiconductor device 10B according to the second specific example. As illustrated in FIG. 7, in the semiconductor device 10B, a laminated body 200 is configured by sequentially laminating a first buffer layer 211, a mask layer 220, a second buffer layer 212, a channel layer 230, a spacer layer 241, and a barrier layer 240 in order from the side of a substrate 100 which is a Si substrate.

The semiconductor device 10B according to the second specific example differs from the semiconductor device 10A according to the first specific example in that the mask layer 220 is provided between the first buffer layer 211 and the second buffer layer 212. In such a case, the second buffer layer 212, the channel layer 230, or both of them provided on the upper layer side of the mask layer 220 are provided with a compensated area CA containing C, which is a compensation factor, at a concentration of $6\times10^{18}$ cm$^{-3}$ or more.

The mask layer 220 may be provided on the laminated body 200 on the lower layer side of the channel layer 230 even when it is not provided directly below the channel layer 230. Thus, similarly to the semiconductor device 10A of the first specific example, in the semiconductor device 10B of the second specific example, the density of threading dislocations in the laminated body 200 can be reduced without increasing a leakage current.

Third Specific Example

Figure 8:
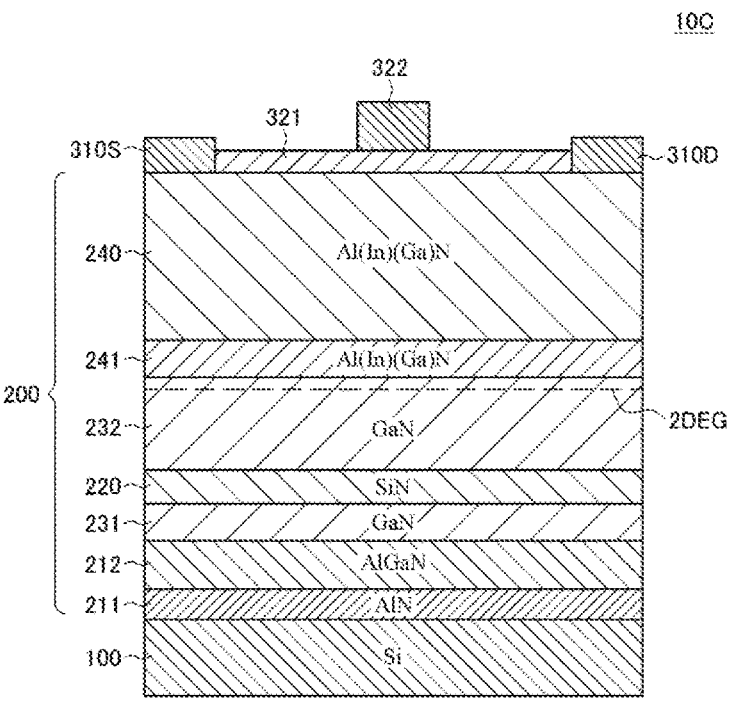
FIG. 8 is a longitudinal sectional view illustrating a configuration of a semiconductor device according to a third specific example.

FIG. 8 is a longitudinal sectional view illustrating a configuration of the semiconductor device 10C according to the third specific example. As illustrated in FIG. 8, in the semiconductor device 10C, a laminated body 200 is configured by sequentially laminating a first buffer layer 211, a second buffer layer 212, a first channel layer 231, a mask layer 220, a second channel layer 232, a spacer layer 241, and a barrier layer 240 in order from the side of a substrate 100 which is a Si substrate. The first channel layer 231 and the second channel layer 232 are formed of GaN.

The semiconductor device 10C according to the third specific example differs from the semiconductor device 10A according to the first specific example in that the mask layer 220 is provided between the first channel layer 231 and the second channel layer 232. In such a case, the second channel layer 232 provided on the upper layer side of the mask layer 220 is provided with a compensated area CA containing C, which is a compensation factor, at a concentration of $6 \times 10^{18}$ cm$^{-3}$ or more. A channel through which electrons supplied from the barrier layer 240 move is formed on the barrier layer 240 side of the second channel layer 232.

The mask layer 220 is provided on the first channel layer 231 formed of GaN, and thus it is possible to improve crystallinity of the second channel layer 232 while reducing the density of threading dislocations in the second channel layer 232. Thus, similarly to the semiconductor device 10A of the first specific example, in the semiconductor device 10C of the third specific example, the density of threading dislocations in the laminated body 200 can be reduced without increasing a leakage current.

Fourth Specific Example

Figure 9:
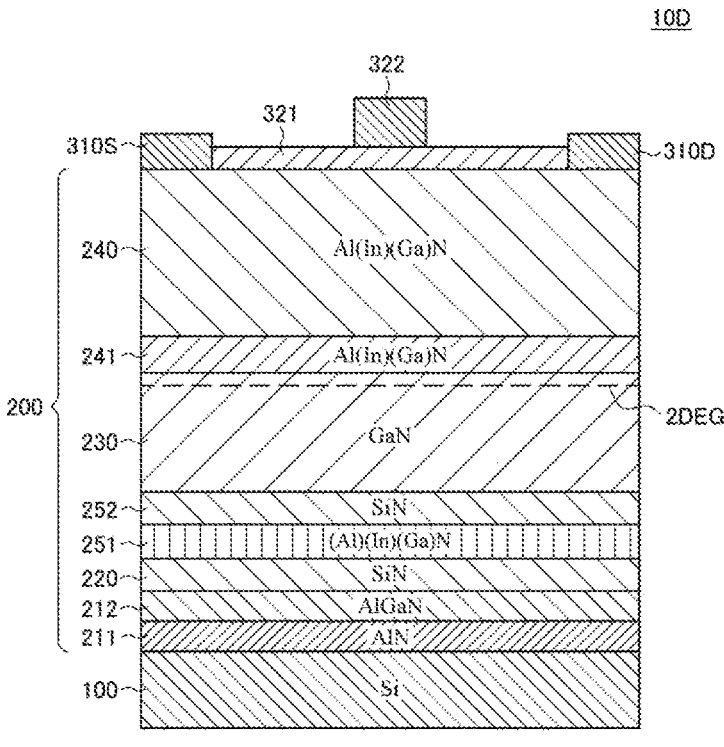
FIG. 9 is a longitudinal sectional view illustrating a configuration of a semiconductor device according to a fourth specific example.

FIG. 9 is a longitudinal sectional view illustrating a configuration of the semiconductor device 10D according to the fourth specific example. As illustrated in FIG. 9, in the semiconductor device 10D, a laminated body 200 is configured by sequentially laminating a first buffer layer 211, a second buffer layer 212, a mask layer 220, an inter mask layer 251, an upper mask layer 252, a channel layer 230, a spacer layer 241, and a barrier layer 240 in order from the side of a substrate 100 which is a Si substrate.

The inter-mask layer 251 is formed of (Al)(In)(Ga)N and is provided on the mask layer 220. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN. The upper mask layer 252 is formed of SiN containing Si, which is an n-type conversion factor, and is provided on the inter-mask layer 251.

The semiconductor device 10D of the fourth specific example differs from the semiconductor device 10A of the first specific example in that a plurality of layers (the mask layer 220 and the upper mask layer 252) formed of SiN are provided. The semiconductor device 10D according to the fourth specific example may be provided to include three or more layers formed of SiN by repeatedly laminating two layers, that is, the inter-mask layer 251 formed of (Al)(In) (Ga)N and the upper mask layer 252 formed of SiN a plurality of times as a repetition unit. In such a case, the channel layer 230 provided on the upper layer side of the upper mask layer 252 which is the uppermost layer among the layers formed of SiN is provided with a compensated area CA containing C, which is a compensation factor, at a concentration of $6 \times 10^{18}$ cm$^{-3}$ or more.

The semiconductor device 10D according to the fourth specific example is provided with a plurality of layers (the mask layer 220 and the upper mask layer 252) formed of SiN, and thus the occurrence of threading dislocations in the laminated body 200 can be further reduced. For this reason, according to the semiconductor device 10D of the fourth specific example, it is possible to further reduce the density of threading dislocations in the laminated body 200 without increasing a leakage current.

Fifth Specific Example

Figure 10:
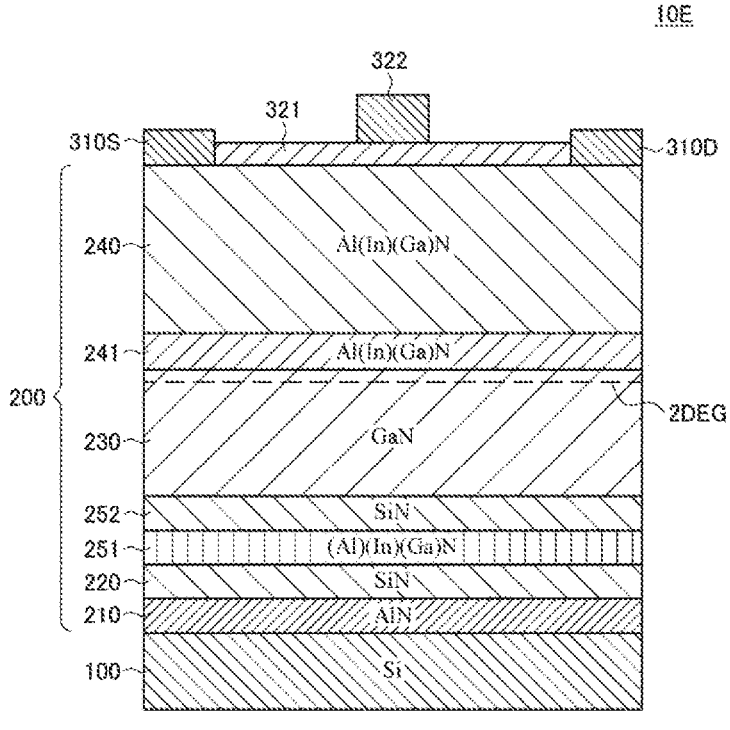
FIG. 10 is a longitudinal sectional view illustrating a configuration of a semiconductor device according to a fifth specific example.

FIG. 10 is a longitudinal sectional view illustrating a configuration of the semiconductor device 10E according to the fifth specific example. As illustrated in FIG. 10, in the semiconductor device 10E, a laminated body 200 is configured by sequentially laminating a buffer layer 210, a mask layer 220, an inter-mask layer 251, an upper mask layer 252, a channel layer 230, a spacer layer 241, and a barrier layer 240 in order from the side of a substrate 100 which is a Si substrate.

The buffer layer 210 is formed of AlN, and the mask layer 220 is formed of SiN. The inter-mask layer 251 is formed of (Al)(In)(Ga)N and is provided on the mask layer 220. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN. The upper mask layer 252 is formed of SiN containing Si, which is an n-type conversion factor, and is provided on the inter-mask layer 251.

The semiconductor device 10E according to the fifth specific example differs from the semiconductor device 10D according to the fourth specific example in that the buffer layer 210 is provided instead of the first buffer layer 211 and the second buffer layer 212.

Similarly to in the semiconductor device 10D according to the fourth specific example, in the semiconductor device 10E according to the fifth specific example, a plurality of layers (the mask layer 220 and the upper mask layer 252) formed of SiN are provided, and thus the occurrence of threading dislocations in the laminated body 200 can be further reduced. Thus, according to the semiconductor device 10E of the fifth specific example, it is possible to further reduce the density of threading dislocations in the laminated body 200 without increasing a leakage current.

Sixth Specific Example

Figure 11:
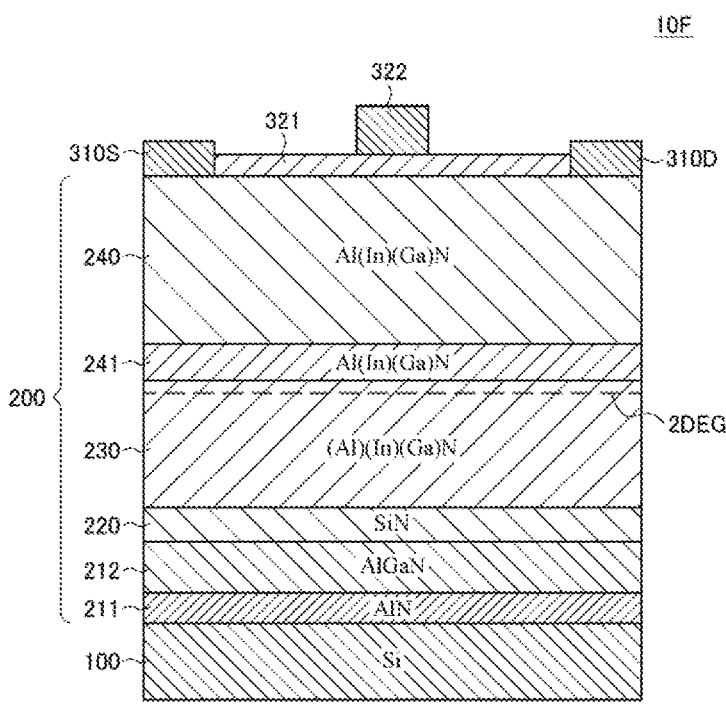
FIG. 11 is a longitudinal sectional view illustrating a configuration of a semiconductor device according to a sixth specific example.

FIG. 11 is a longitudinal sectional view illustrating a configuration of the semiconductor device 10F according to the sixth specific example. As illustrated in FIG. 11, in the semiconductor device 10F, a laminated body 200 is configured by sequentially laminating a first buffer layer 211, a second buffer layer 212, a mask layer 220, a channel layer 230, a spacer layer 241, and a barrier layer 240 in order from the side of a substrate 100 which is a Si substrate.

The semiconductor device 10F according to the sixth specific example differs from the semiconductor device 10A according to the first specific example in that the channel layer 230 is formed of (Al)(In)(Ga)N. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN. The channel layer 230 provided on the upper layer side of the mask layer 220 is provided with a compensated area CA containing C, which is a compensation factor, at a concentration of $6 \times 10^{18}$ cm$^{-3}$ or more.

The channel layer 230 may be constituted by any nitride semiconductor as long as it can generate a two-dimensional electron gas (2DEG) by bonding with the barrier layer 240. Thus, similarly to the semiconductor device 10A according to the first specific example, according to the semiconductor device 10F of the sixth specific example, the density of threading dislocations in the laminated body 200 can be reduced without increasing a leakage current.

Seventh Specific Example

Figure 12:
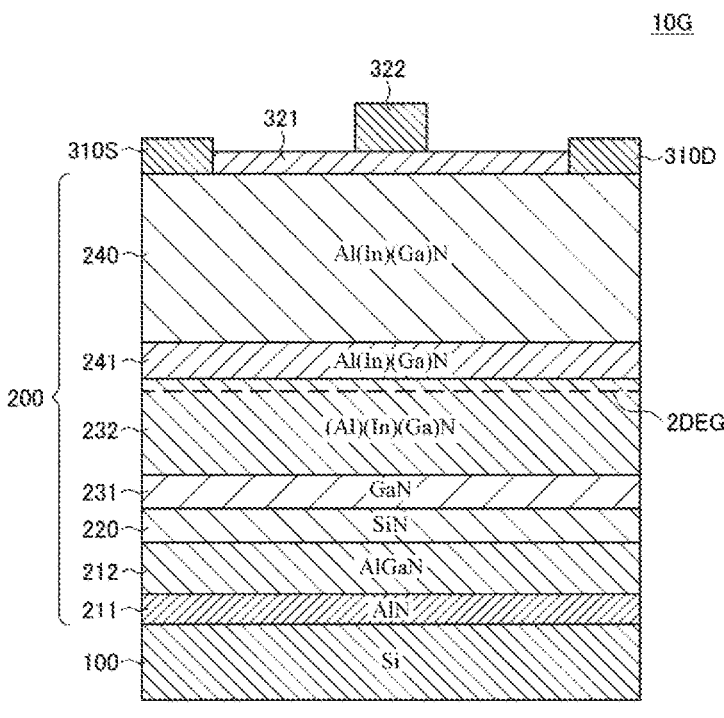
FIG. 12 is a longitudinal sectional view illustrating a configuration of a semiconductor device according to a seventh specific example.

FIG. 12 is a longitudinal sectional view illustrating a configuration of the semiconductor device 10G according to the seventh specific example. As illustrated in FIG. 12, in the semiconductor device 10G, a laminated body 200 is configured by sequentially laminating a first buffer layer 211, a second buffer layer 212, a mask layer 220, a first channel layer 231, a second channel layer 232, a spacer layer 241, and a barrier layer 240 in order from the side of a substrate 100 which is a Si substrate.

The semiconductor device 10G according to the seventh specific example differs from the semiconductor device 10A according to the first specific example in that the first channel layer 231 and the second channel layer 232 are provided instead of the channel layer 230. The first channel layer 231 is formed of GaN, and the second channel layer 232 is formed of (Al)(In)(Ga)N. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN. In the first channel layer 231, the second channel layer 232, or both of them provided on the upper layer side of the mask layer 220 are provided with a compensated area CA containing C, which is a compensation factor, at a concentration of $6 \times 10^{18}$ cm$^{-3}$ or more.

The channel layer 230 may be constituted by any nitride semiconductor and layer structure as long as it can generate a two-dimensional electron gas (2DEG) by bonding with the barrier layer 240. Thus, similarly to the semiconductor device 10A according to the first specific example, according to the semiconductor device 10G of the seventh specific example, the density of threading dislocations in the laminated body 200 can be reduced without increasing a leakage current.

Eighth Specific Example

Figure 13:
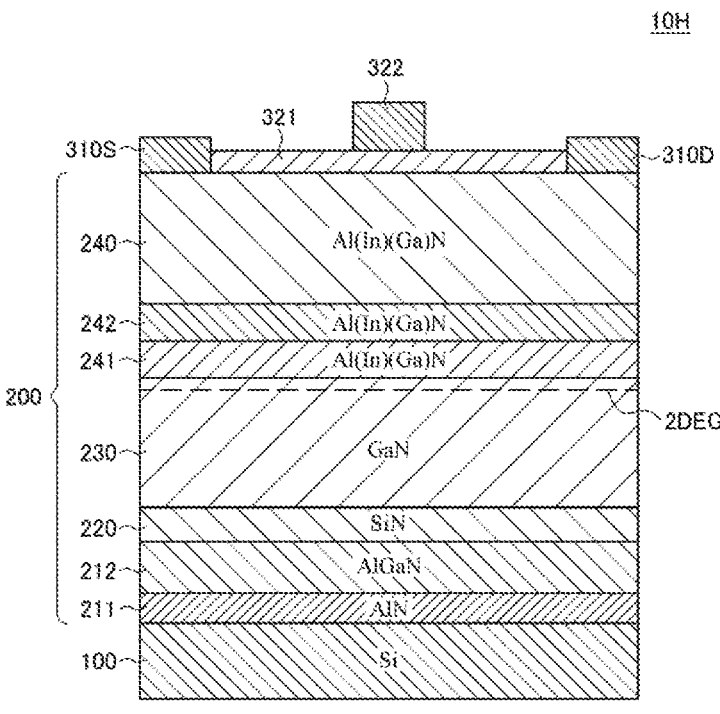
FIG. 13 is a longitudinal sectional view illustrating a configuration of a semiconductor device according to an eighth specific example.

FIG. 13 is a longitudinal sectional view illustrating a configuration of the semiconductor device 10H according to the eighth specific example. As illustrated in FIG. 13, in the semiconductor device 10H, a laminated body 200 is configured by sequentially laminating a first buffer layer 211, a second buffer layer 212, a mask layer 220, a channel layer 230, a spacer layer 241, an intermediate layer 242, and a barrier layer 240 in order from the side of a substrate 100 which is a Si substrate.

The semiconductor device 10H according to the eighth specific example differs from the semiconductor device 10A according to the first specific example in that the intermediate layer 242 is further provided between the spacer layer 241 and the barrier layer 240. The intermediate layer 242 is formed of (Al)(In)(Ga)N. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN.

The intermediate layer 242 can further improve crystallinity of the barrier layer 240 by changing the composition of the nitride semiconductor between the barrier layer 240 and the spacer layer 241 in a stepwise manner. Accordingly, the semiconductor device 10H according to the eighth specific example can further improve device characteristics by improving crystallinity of the barrier layer 240.

Ninth Specific Example

Figure 14:
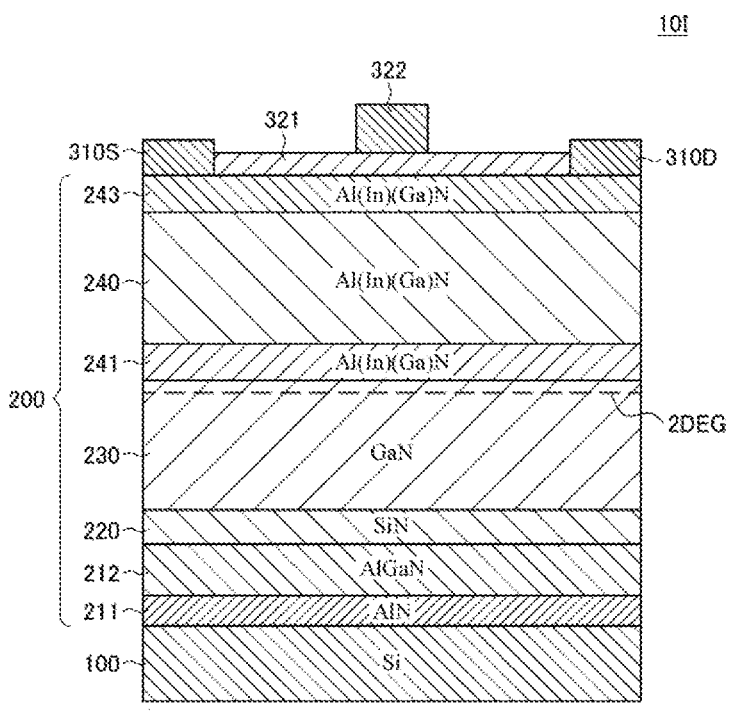
FIG. 14 is a longitudinal sectional view illustrating a configuration of a semiconductor device according to a ninth specific example.

FIG. 14 is a longitudinal sectional view illustrating a configuration of the semiconductor device 10I according to the ninth specific example. As illustrated in FIG. 14, in the semiconductor device 10I, a laminated body 200 is configured by sequentially laminating a first buffer layer 211, a second buffer layer 212, a mask layer 220, a channel layer 230, a spacer layer 241, a barrier layer 240, and a protection layer 243 in order from the side of a substrate 100 which is a Si substrate.

The semiconductor device 10I according to the ninth specific example differs from the semiconductor device 10A according to the first specific example in that the protection layer 243 is further provided on the barrier layer 240. The protection layer 243 is formed of (Al)(In)(Ga)N. (Al)(In)(Ga)N represents a nitride semiconductor in which N is an essential element and Al, In, and Ga are optional elements. Specifically, (Al)(In)(Ga)N is AlInGaN, AlGaN, AlInN, InGaN, AlN, InN, or GaN.

Since the protection layer 243 can suppress oxidation of the surface of the barrier layer 240, it is possible to improve process resistance of the laminated body 200 in the manufacturing process. Accordingly, the semiconductor device 10I according to the ninth specific example can suppress deterioration of device characteristics in the manufacturing process.

<4. Configuration Example of Wireless Communication Device>

Figure 15:
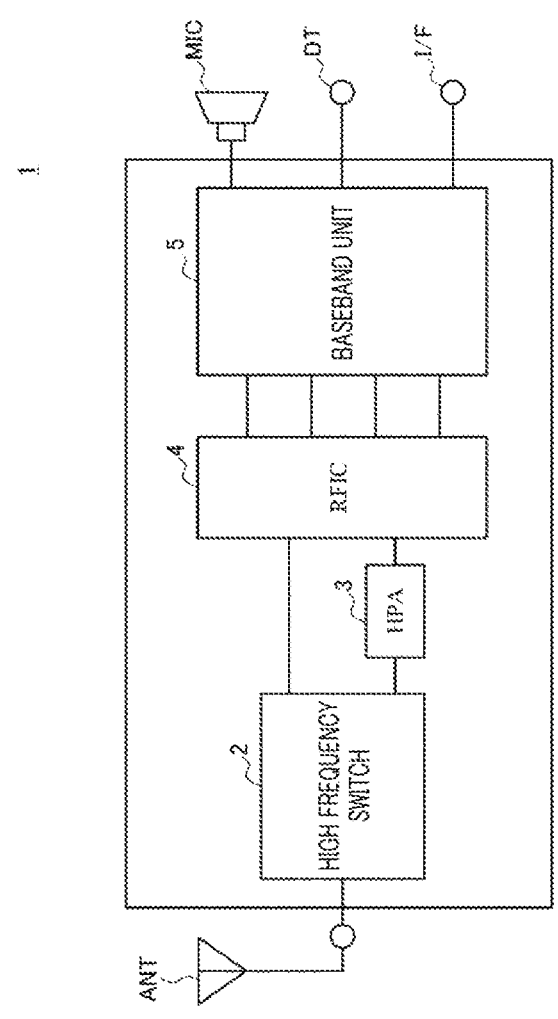
FIG. 15 is a block diagram illustrating a configuration of a wireless communication device according to a second embodiment of the present disclosure.

Subsequently, a wireless communication device according to a second embodiment of the present disclosure will be described with reference to FIG. 15. FIG. 15 is a block diagram illustrating a configuration of a wireless communication device 1 according to the present embodiment.

As illustrated in FIG. 15, the wireless communication device 1 includes an antenna ANT, a high frequency switch 2, a high power amplifier (HPA) 3, a radio frequency integrated circuit (RFIC) 4, a baseband unit 5, a sound output unit MIC, a data output unit DT, and an interface unit I/F. The wireless communication device 1 includes the semiconductor device 10 according to the first embodiment of the present disclosure as a semiconductor device included in the high frequency switch 2, the high power amplifier 3, the high frequency integrated circuit 4, the baseband unit 5, or the like.

The wireless communication device 1 is, for example, a mobile phone system that realizes multiple functions such as sound communication, data communication, and local area network (LAN) connection. The wireless communication device 1 may be a mobile phone system compatible with a fifth generation mobile communication system (so-called 5G).

In the wireless communication device 1, a transmitted signal output from the baseband unit 5 is output to the antenna ANT via the high frequency integrated circuit 4, the high power amplifier 3, and the high frequency switch 2 during transmission. In the wireless communication device 1, a received signal received by the antenna ANT is input to the baseband unit 5 via the high frequency switch 2 and the high frequency integrated circuit 4 during reception. The received signal processed by the baseband unit 5 is output from the sound output unit MIC, the data output unit DT, the interface unit I/F, or the like.

By including the semiconductor device 10 according to the first embodiment of the present disclosure in a circuit that deals with a transmitted signal or a received signal, the wireless communication device 1 can process higher output signals more efficiently.

Although the preferred embodiments of the present disclosure have been described in detail with reference to the accompanying figures as described above, the technical scope of the present disclosure is not limited to such examples. It is apparent that those having ordinary knowledge in the technical field of the present disclosure could conceive various modified examples or changed examples within the scope of the technical ideas set forth in the claims, and it should be understood that these also naturally fall within the technical scope of the present disclosure.

For example, in the above-described embodiments, the semiconductor device 10 has been described as a high electron mobility transistor (HEMT), but the technology according to the present disclosure is not limited to the above-described example. The technology according to the present disclosure is also similarly applicable to various semiconductor devices, such as light emitting diodes, laser diodes, photodiodes, heterojunction bipolar transistors, field effect transistors, and Schottky barrier diodes, in which a nitride semiconductor is crystal-grown. Thus, it is understood that the various semiconductor devices described above are naturally included in the category of the semiconductor device according to the present embodiment.

Further, the effects described in the present specification are merely explanatory or exemplary and are not intended as limiting. That is, the techniques according to the present disclosure may exhibit other effects apparent to those skilled in the art from the description herein, in addition to or in place of the above effects.

Note that the following configurations also fall within the technical scope of the present disclosure.

(1)

A semiconductor device including:
a channel layer that is included in a laminated body of a nitride semiconductor provided on a substrate; and
a barrier layer that is included in the laminated body on an upper layer side with respect to the channel layer,
wherein the laminated body on a lower layer side with respect to the channel layer includes an n-type conversion factor that converts the nitride semiconductor into an n-type in a concentration profile having at least one or more peaks in a lamination direction of the laminated body, and
a compensated area including $6 \times 10^{18}$ cm$^{-3}$ or more of a compensation factor for compensating for the n-type conversion factor is provided in the laminated body on an upper layer side with respect to peaks of the concentration profile of the n-type conversion factor.

(2)

The semiconductor device according to (1),
wherein the n-type conversion factor includes at least one of a impurity or a defect included in the laminated body.

(3)

The semiconductor device according to (1) or (2),
wherein the compensation factor includes at least one of a impurity or a defect included in the laminated body.

(4)

The semiconductor device according to any one of (1) to (3),
wherein the compensated area has sheet resistance of 400 Ω/sq or more.

(5)

The semiconductor device according to any one of (1) to (4),
wherein density of a threading dislocation on a surface of the laminated body which is opposite to the surface on which the substrate is provided is $3 \times 10^9$ cm$^{-2}$ or less.

(6)

The semiconductor device according to any one of (1) to (5),
wherein the substrate includes at least one or more of Si, SiC, sapphire, GaN, AlN, or diamond.

(7)

The semiconductor device according to any one of (1) to (6),
wherein the nitride semiconductor includes at least one or more of AlN, InN, GaN, AlGaN, InGaN, AlInGaN, AlScN, SiN, MgN, or TiN.

(8)

The semiconductor device according to any one of (1) to (7),
wherein the compensated area has a peak of the concentration profile of the compensation factor in a region within 150 nm on an upper layer side of the peak of the concentration profile of the n-type conversion factor.

(9)

The semiconductor device according to any one of (1) to (8),
wherein the n-type conversion factor includes at least one of Si, Ge, and O.

(10)

The semiconductor device according to any one of (1) to (9),
wherein the compensation factor includes at least one of C, Mg, Fe, and B.

(11)

The semiconductor device according to any one of (1) to (10),
wherein the concentration profile of the n-type conversion factor in the lamination direction of the laminated body includes the peak at which a concentration of the n-type conversion factor is $6 \times 10^{18}$ cm$^{-3}$ or more.

(12)

The semiconductor device according to (11),
wherein a concentration of the compensation factor is equal to or higher than the concentration of the n-type conversion factor at a position of the peak of the n-type conversion factor.

(13)

The semiconductor device according to (11),
wherein the concentration of the compensation factor is less than the concentration of the n-type conversion factor at a position of the peak of the n-type conversion factor.

(14)

The semiconductor device according to any one of (11) to (13),
wherein the concentration profile of the n-type conversion factor in the lamination direction of the laminated body includes the peak at which the concentration of the n-type conversion factor is $1 \times 10^{19}$ cm$^{-3}$ or more.

(15)

The semiconductor device according to any one of (1) to (12),
wherein the concentration of the compensation factor is $6 \times 10^{18}$ cm$^{-3}$ or more in a region where the concentration of the n-type conversion factor is $6 \times 10^{18}$ cm$^{-3}$ or more in the lamination direction of the laminated body.

(16)

The semiconductor device according to any one of (1) to (15), further including:
a gate electrode that is provided on a surface of the laminated body which is opposite to the surface on which the substrate is provided; and
a source electrode and a drain electrode that are provided on the opposite surface with the gate electrode interposed therebetween.

(17)
A wireless communication device including:
a semiconductor device,
wherein the semiconductor device includes
a channel layer that is included in a laminated body of a nitride semiconductor provided on a substrate, and
a barrier layer that is included in the laminated body on an upper layer side with respect to the channel layer,
the laminated body on a lower layer side with respect to the channel layer includes an n-type conversion factor that converts the nitride semiconductor into an n-type in a concentration profile having at least one or more peaks in a lamination direction of the laminated body, and
a compensated area including $6\times10^{18}$ cm$^{-3}$ or more of a compensation factor for compensating for the n-type conversion factor is provided in the laminated body on an upper layer side with respect to peaks of the concentration profile of the n-type conversion factor.

REFERENCE SIGNS LIST

10 Semiconductor device
100 Substrate
200 Laminated body
210 Buffer layer
211 First buffer layer
212 Second buffer layer
220 Mask layer
230 Channel layer
231 First channel layer
232 Second channel layer
240 Barrier layer
241 Spacer layer
242 Intermediate layer
243 Protection layer
251 Inter-mask layer
252 Upper mask layer
310D Drain electrode
310S Source electrode
321 Insulating film
322 Gate electrode

The invention claimed is:
1. A semiconductor device, comprising:
a channel layer that is included in a laminated body of a nitride semiconductor provided on a substrate; and
a barrier layer that is included in the laminated body on an upper layer side with respect to the channel layer,
wherein the laminated body on a lower layer side with respect to the channel layer includes an n-type conversion factor that converts the nitride semiconductor into an n-type in a concentration profile having at least one or more peaks in a lamination direction of the laminated body, and
a compensated area including $6\times10^{18}$ cm$^{-3}$ or more of a compensation factor for compensating for the n-type conversion factor is provided in the laminated body on an upper layer side with respect to peaks of the concentration profile of the n-type conversion factor.
2. The semiconductor device according to claim 1, wherein the n-type conversion factor includes at least one of an impurity or a defect included in the laminated body.
3. The semiconductor device according to claim 1, wherein the compensation factor includes at least one of an impurity or a defect included in the laminated body.

4. The semiconductor device according to claim 1, wherein the compensated area has sheet resistance of 400 Ω/sq or more.
5. The semiconductor device according to claim 1, wherein density of a threading dislocation on a surface of the laminated body which is opposite to a surface on which the substrate is provided is $3\times10^{9}$ cm$^{-2}$ or less.
6. The semiconductor device according to claim 1, wherein the substrate includes at least one or more of Si, SiC, sapphire, GaN, AlN, or diamond.
7. The semiconductor device according to claim 1, wherein the nitride semiconductor includes at least one or more of AlN, InN, GaN, AlGaN, InGaN, AlInGaN, AlScN, SiN, MgN, or TiN.
8. The semiconductor device according to claim 1, wherein the compensated area has a peak of the concentration profile of the compensation factor in a region within 150 nm on an upper layer side of the peak of the concentration profile of the n-type conversion factor.
9. The semiconductor device according to claim 1, wherein the n-type conversion factor includes at least one of Si, Ge, and O.
10. The semiconductor device according to claim 1, wherein the compensation factor includes at least one of C, Mg, Fe, and B.
11. The semiconductor device according to claim 1, wherein the concentration profile of the n-type conversion factor in the lamination direction of the laminated body includes a peak of the one or more peaks at which a concentration of the n-type conversion factor is $6\times10^{18}$ cm$^{-3}$ or more.
12. The semiconductor device according to claim 11, wherein a concentration of the compensation factor is equal to or higher than the concentration of the n-type conversion factor at a position of the peak of the n-type conversion factor.
13. The semiconductor device according to claim 11, wherein the concentration of the compensation factor is less than the concentration of the n-type conversion factor at a position of the peak of the n-type conversion factor.
14. The semiconductor device according to claim 11, wherein the concentration profile of the n-type conversion factor in the lamination direction of the laminated body includes the peak at which the concentration of the n-type conversion factor is $1\times10^{19}$ cm$^{-3}$ or more.
15. The semiconductor device according to claim 1, wherein a concentration of the compensation factor is $6\times10^{18}$ cm$^{-3}$ or more in a region where a concentration of the n-type conversion factor is $6\times10^{18}$ cm$^{-3}$ or more in the lamination direction of the laminated body.
16. The semiconductor device according to claim 1, further comprising:
a gate electrode that is provided on an opposite surface of the laminated body which is opposite to a surface on which the substrate is provided; and
a source electrode and a drain electrode that are provided on the opposite surface with the gate electrode interposed therebetween.
17. A wireless communication device, comprising:
a semiconductor device,
wherein the semiconductor device includes
a channel layer that is included in a laminated body of a nitride semiconductor provided on a substrate, and
a barrier layer that is included in the laminated body on an upper layer side with respect to the channel layer,
the laminated body on a lower layer side with respect to the channel layer includes an n-type conversion factor that converts the nitride semiconductor into an n-type in a concentration profile having at least one or more peaks in a lamination direction of the laminated body, and a compensated area including $6 \times 10^{18}$ cm$^{-3}$ or more of a compensation factor for compensating for the n-type conversion factor is provided in the laminated body on an upper layer side with respect to peaks of the concentration profile of the n-type conversion factor.

* * * * *